United States Patent
Oyamada (10) Patent No.: US 8,212,272 B2
(45) Date of Patent: Jul. 3, 2012

(54) LIGHT-EMITTING DIODE

(75) Inventor: Nodoka Oyamada, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 350 days.

(21) Appl. No.: 12/582,924

(22) Filed: Oct. 21, 2009

(65) Prior Publication Data

US 2010/0102347 A1    Apr. 29, 2010

(30) Foreign Application Priority Data

Oct. 23, 2008    (JP) ................... 2008-273112

(51) Int. Cl.
*H01L 33/20* (2010.01)
*H01L 33/46* (2010.01)

(52) U.S. Cl. .......... 257/98; 257/E33.065; 257/E33.067; 257/E33.072

(58) Field of Classification Search ............ 257/98, 257/E33.067, E33.065, E33.072
See application file for complete search history.

(56) References Cited

U.S. PATENT DOCUMENTS

| | | | | |
|---|---|---|---|---|
| 5,990,498 | A * | 11/1999 | Chapnik et al. | 257/99 |
| 7,196,358 | B1 * | 3/2007 | Chen | 257/98 |
| 2005/0280018 | A1 | 12/2005 | Imai | |
| 2008/0297047 | A1 * | 12/2008 | Kohno et al. | 313/512 |

FOREIGN PATENT DOCUMENTS

| | | |
|---|---|---|
| JP | 200323183 A | 1/2003 |
| JP | 2005353802 A | 12/2005 |

* cited by examiner

*Primary Examiner* — Thao Le
*Assistant Examiner* — Tanika Warrior
(74) *Attorney, Agent, or Firm* — Browdy and Neimark, PLLC (57) ABSTRACT

A light-emitting diode includes a substrate (12) having an upper surface, a lower surface, and a peripheral side surface, a pair of upper electrodes (13a, 13b) provided on upper surface portions of the substrate, at least one light emitting element (14) mounted one of the pair of upper electrodes, and a covering member (18) provided on the upper surface of the substrate except the upper surface portions at which the pair of upper electrodes are provided. The covering member (18) includes a recess (19), and a light-shielding resin (20) filled in the recess (19).

14 Claims, 10 Drawing Sheets

LIGHT-EMITTING DIODE

CROSS-REFERENCE TO THE RELATED APPLICATION

The application is based on and claims the priority benefit of Japanese Patent Application No. 2008-273112, filed on Oct. 23, 2008, the entire descriptions of which are incorporated herein by reference.

BACKGROUND OF THE INVENTION

1. Field of the Invention

The present invention relates to a light-emitting diode (hereinafter, referred to as LED) configured to mount a light-emitting element on a substrate provided with electrodes.

2. Description of the Related Art

A conventional LED includes a light-emitting element mounted on a substrate provided with a pair of electrodes, and the light-emitting element is electrically connected to the pair of electrodes on the substrate through bumps, wires, and/or mounting the light-emitting element at its one of a pair of element-electrodes disposed on one of the pair of electrodes of the substrate. (see, for reference, Japanese Unexamined Patent Application Publication Nos. 2005-353802 and 2003-23183).

Figure 9:
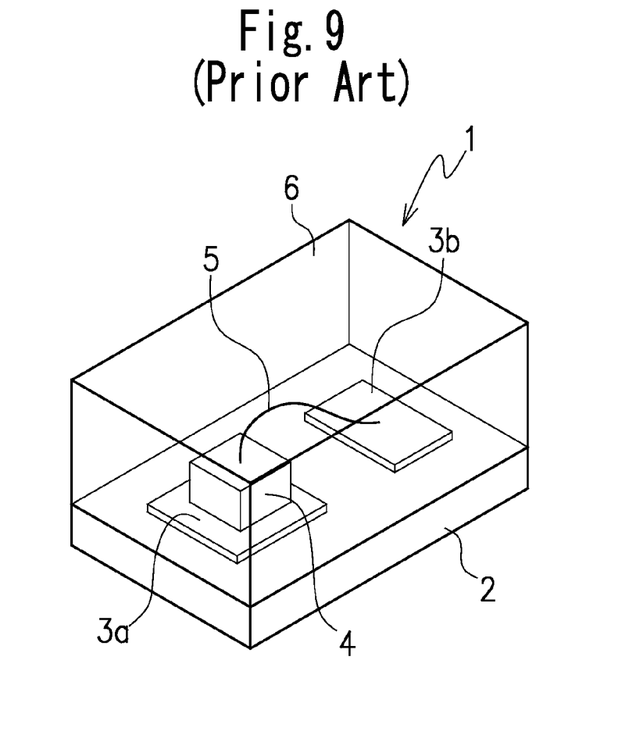
FIG. 9 is a perspective view showing a conventional LED.
Figure 10:
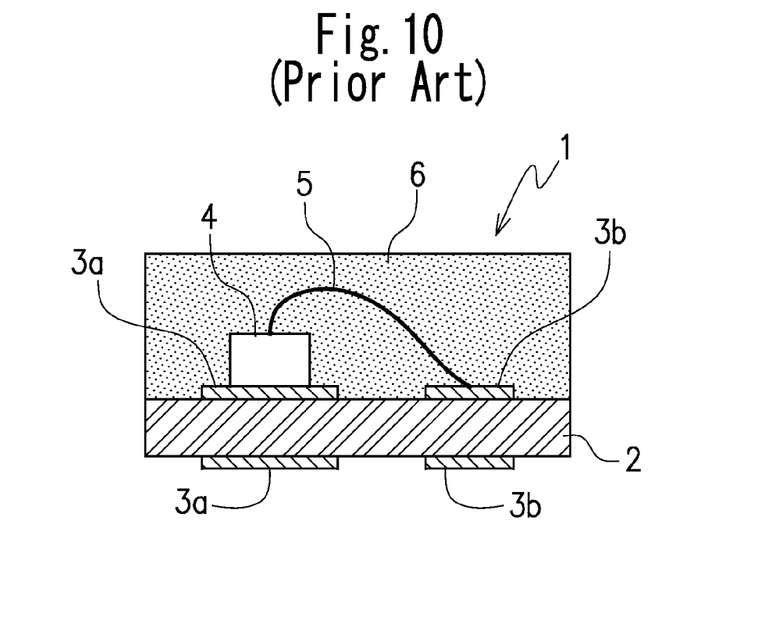
FIG. 10 is a sectional view showing the conventional LED.

FIGS. 9 and 10 illustrate a structure from the aforementioned conventional LEDs. An LED 1 includes a substrate 2, a pair of upper electrodes 3a and 3b formed on an upper surface of the substrate 2 by etching a metallic film formed on the upper surface of the substrate, a light-emitting element 4 disposed on one 3a of the pair of upper electrodes and connected to another 3b of the pair of upper electrodes through a bonding wire 5, and a light-transmitting member 6 provided on the upper surface of the substrate 2 to seal the light-emitting element 4 and electrical connecting portions to the light-emitting element 4.

Each of the upper electrodes 3a and 3b are electrically connected to each of a pair of lower electrodes 3a and 3b provided on a lower surface of the substrate 2 by a through-hole penetrating from the upper surface and the lower surface of the substrate. The light-transmitting member 6 is formed on the upper surface of the substrate to seal the light-emitting element 4, the bonding wire 5, and the pair of upper electrodes 3a and 3b.

Figure 11A:
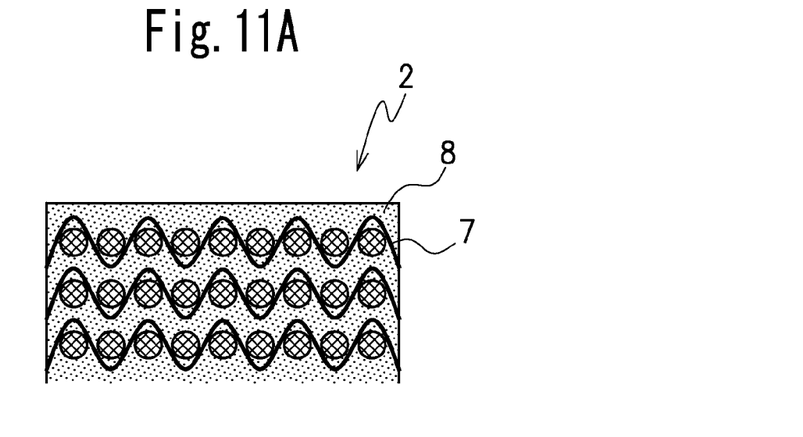
FIG. 11A is a sectional schematic diagram showing an inner structure of a substrate used in the LED.
Figure 11B:
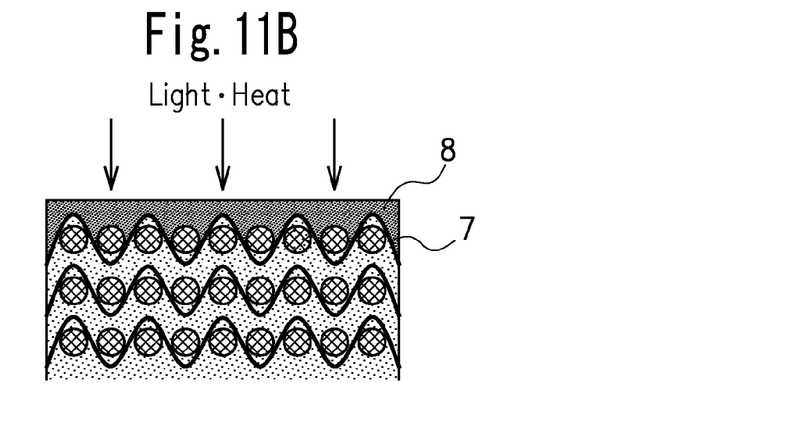
FIG. 11B is a sectional schematic diagram showing a state of the substrate when light or heat is irradiated to an upper surface of the substrate.
Figure 11C:
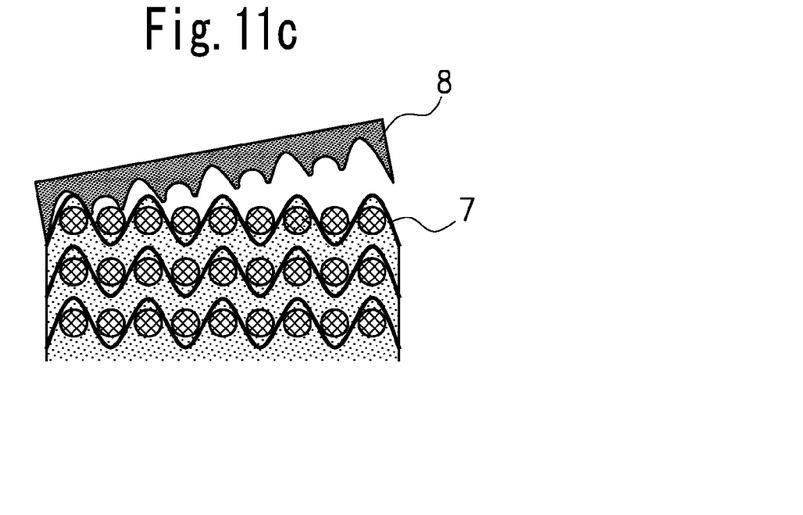
FIG. 11C is a sectional schematic diagram of the substrate showing a state where a resin material is peeled from the substrate including a glass cloth as a core material and resin.

The substrate 2 includes a glass cloth 7 as a core material and a resin material 8 such as glass epoxy-based resin, BT resin, or the like covering the glass cloth 7, as shown in FIG. 11A. Because the resin material 8 in general deteriorates by light radiation and/or heat, and if deterioration of the resin material 8 in the substrate 2 proceeds, the resin material 8 may be discolored as shown in FIG. 11B and a layer of the resin material 8 may be peeled off as shown in FIG. 11C, and that affects the product quality of LED.

Since an upper surface of the substrate 2 except portions where the pair of upper electrodes 3a and 3b are provided is exposed to light emission from the light-emitting element 4, the upper surface of the substrate of such an LED 1 as shown in FIGS. 9 and 10, for example, is affected by light radiation as mentioned above In addition, if the exposed upper surface of the substrate has a large area, the exposed area absorbs and wastes light emitted from the light-emitting element. Accordingly, light absorbed in the exposed area of the substrate not only deteriorates the substrate but also wastes light emission of the light-emitting element.

SUMMARY OF THE INVENTION

An object of the present invention is to provide an LED configured to block light and/or heat from a light-emitting element toward an upper surface of the substrate to prevent the substrate from being deteriorated.

To achieve the above object, an LED according to one embodiment of the present invention includes a substrate having an upper surface, a lower surface, and a peripheral side surface, a pair of upper electrodes provided on portions of the upper surface of the substrate, at least one light-emitting element mounted on one of the pair of upper electrodes, and a covering member provided on the upper surface of the substrate except the portions at which the pair of upper electrodes are provided.

The covering member is configured to shield the upper surface of the substrate except the portions at which the pair of upper electrodes are provided to prevent the upper surface of the substrate from being exposed to light emission of the light-emitting element.

DETAILED DESCRIPTION OF THE PREFERRED EMBODIMENTS

The present invention will be explained with embodiments in detail hereinafter with reference to the accompanying drawings.

Figure 1:
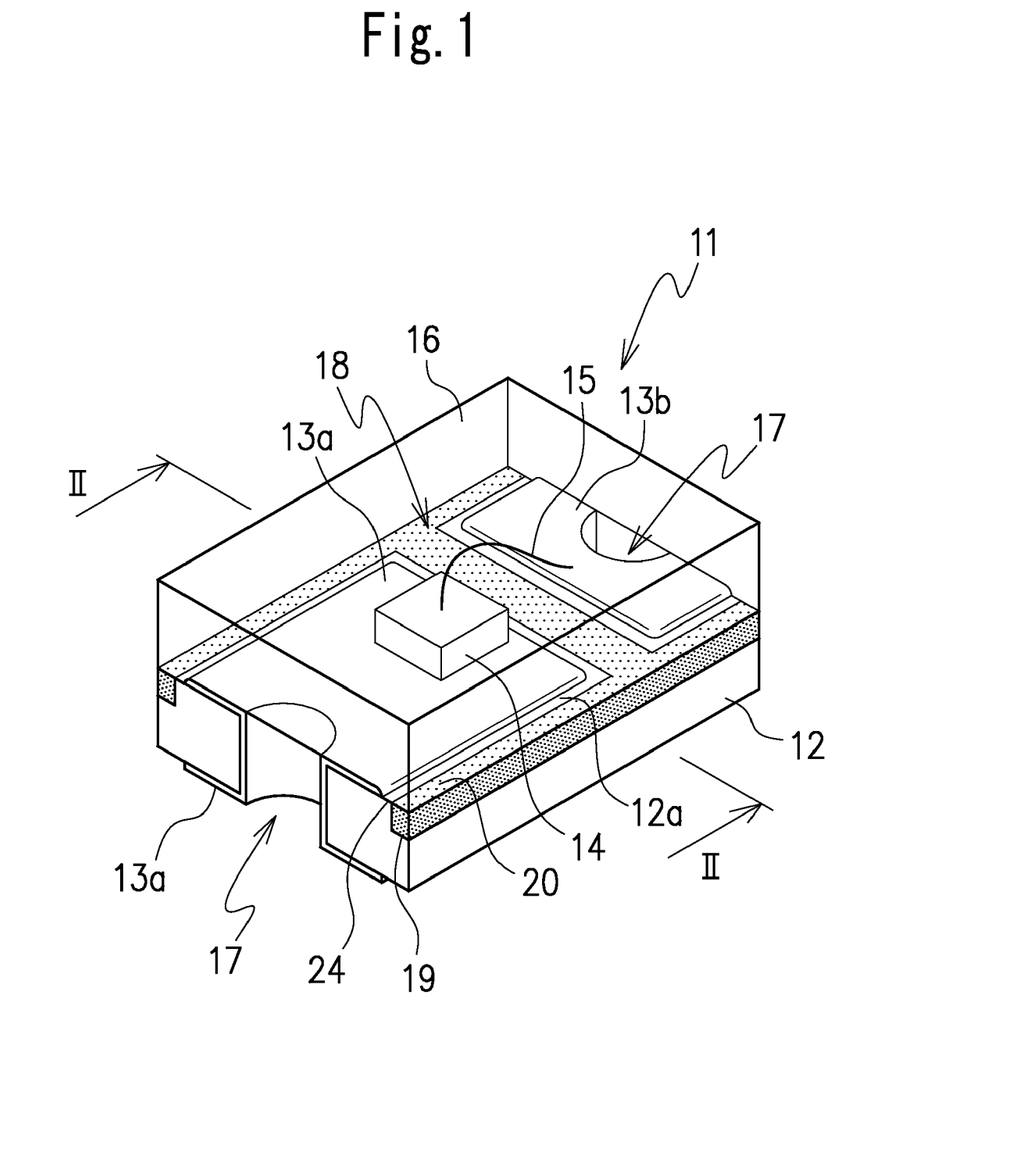
FIG. 1 is a perspective view showing a structure of an LED according to a first embodiment of the present invention.
Figure 2:
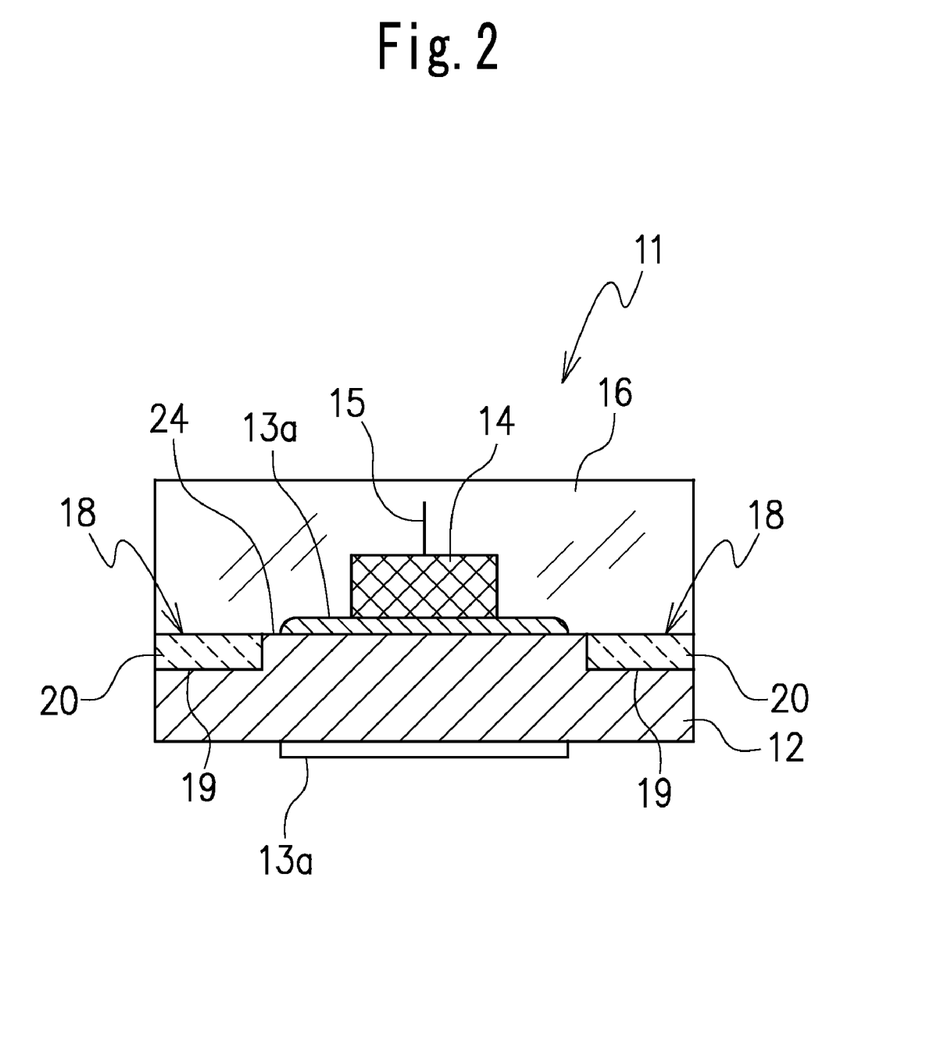
FIG. 2 is a sectional view of the LED taken along line II-II in FIG. 1.
Figure 3:
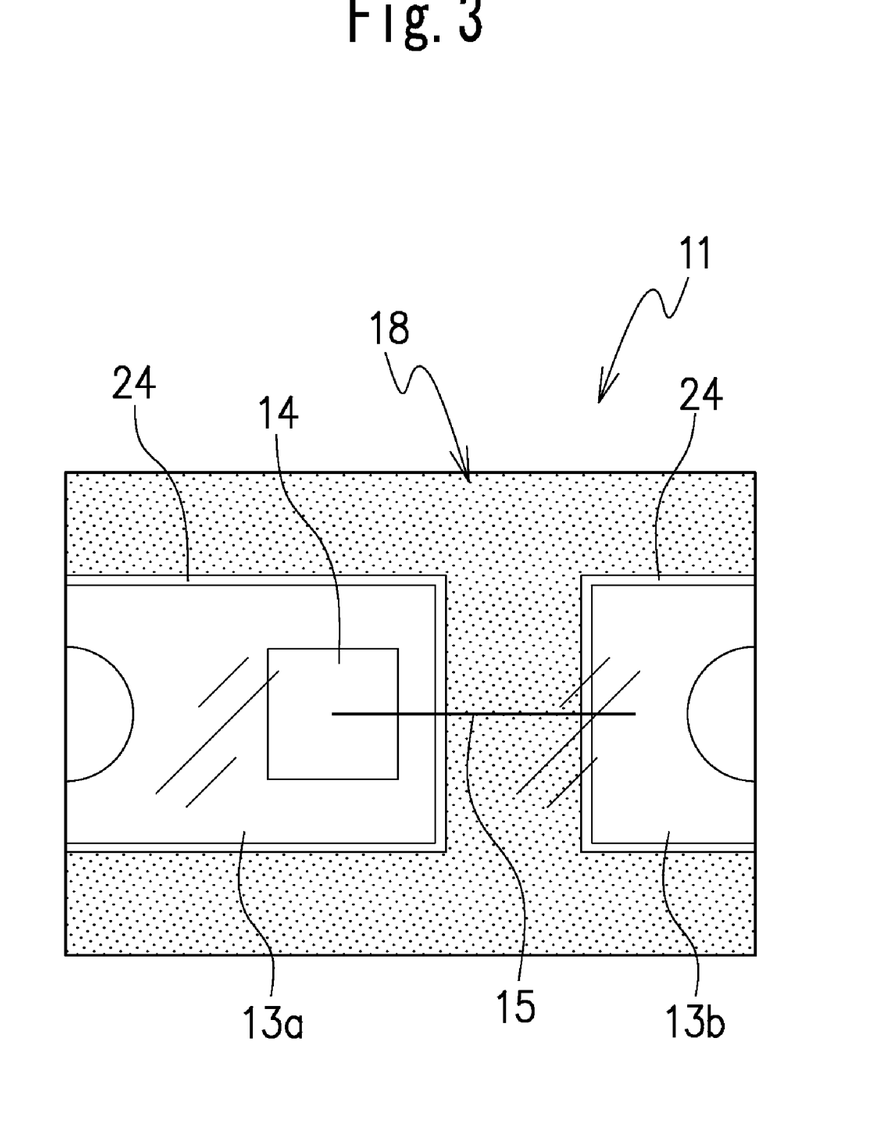
FIG. 3 is a plan view showing the LED according to the first embodiment.

FIGS. 1 to 3 illustrate a light-emitting diode (LED) according to a first embodiment of the present invention.

The LED 11 includes a substrate 12 having an upper surface 12a, a lower surface, a peripheral side surface between the upper surface and the lower surface, a pair of upper electrodes 13a and 13b provided on the upper surface 12a of the substrate 12, at least one light-emitting element 14 disposed on the substrate 12. The substrate 12 has a plate shape, for example, a rectangular plate shape with four sides at the peripheral side surface. In this embodiment, the light-emitting element 14 is mounted on one 13a of the pair of upper electrodes and connected to another 13b of the pair of upper electrodes by a bonding wire 15, and the pair of upper electrodes 13a and 13b are provided on portions of the upper surface of the substrate. The substrate 12 has an upper surface area exposed from the pair of upper electrodes 13a and 13b.

A covering member 18 is disposed at the upper surface area exposed from the pair of upper electrodes to prevent light from being absorbed in the upper surface of the substrate exposed from the pair of upper electrodes 13a and 13b.

In this way, the covering member 18 is formed on the entire upper surface exposed from the pair of upper electrodes 13a and 13b. Here, the covering member 18 includes a recess provided in the upper surface of the substrate 12 at the exposed upper surface area and a light-shielding resin filled in the recess. The light-shielding resin of the covering member 18 prevents light from irradiating the upper surface of the substrate.

The substrate 12 has a structure including a glass cloth 7 as a core material, and an insulation material 8 such as glass epoxy resin, BT (bismaleimide triazine) resin or the like covering the glass cloth 7, as shown in FIG. 11A. The glass cloth 7 may be used as a single sheet or layered sheets. The upper electrodes 13a and 13b and lower electrodes 13a and 13b may be formed on the substrate 12 by etching a conductive film, for example, a metallic film provided on each of the upper surface and the lower surface of the substrate 12 as a predetermined pattern. The electrical connection portion of the substrate 12 include the pair of upper electrodes 13a and 13b provided on the upper surface of the substrate, the lower electrodes 13a and 13b provided on the lower surface of the substrate, and through-holes 15 each electrically connecting each corresponding upper electrode to each corresponding lower electrode.

In this embodiment, two through-holes 17 are provided on two opposite sides of the peripheral side surface of the substrate 12 (see FIG. 2).

The light-emitting element 14 mounted on one of the pair of upper electrodes is, for example, a square-shaped chip including a pair of element electrodes. In this embodiment one of the pair of element electrodes is located at a lower surface of the light-emitting element 14 and electrically mounted on one 13a of the pair of upper electrodes and another element electrode is located at an upper surface of the light-emitting element 14 and electrically connected to another 13b of the upper electrode through the bonding wire 15.

The covering member 18 includes a recess 19 provided in the upper surface of the substrate along another two opposite sides of the substrate where the through-holes are not provided and also provided between the pair of upper electrodes 13a and 13b. In this embodiment the recess 19 is formed in a shape of H in the upper surface of the substrate, and the light-shielding resin 20 is filled in the H-shaped recess. A silicone-based resin or a hybrid resin containing silicone is used for the light-shielding resin 20. The light-shielding resin 20 is disposed in the recess to be securely formed on the upper surface of the substrate 12 and to have a constant thickness, and therefore, it is possible to prevent the upper surface of the substrate 12 from being exposed to direct light from the light-emitting element 14.

In addition, it is possible to acquire an optimum light-shielding effect by adjusting a depth of the recess 19 in accordance with a luminance intensity of light-emitting element 14 to be disposed on the upper surface of the substrate.

Each of the upper surface portions of the substrate on which each of the pair of upper electrodes 13a and 13b are formed has an edging 24 slightly exposed from each of the upper electrodes 13a and 13b. In this embodiment, the edging 24 of each of the upper surface portions is exposed from each of the pair of upper electrodes along three sides of the corresponding upper electrode. In this way, because each of the upper surface portions of the substrate 12 on which each of the pair of upper electrodes is formed is larger than the corresponding upper electrode for the edging 24, it is possible to dispose each of the upper electrodes 13a and 13b on each of the upper surface portions of the substrate stably and prevent the electrode part from being peeled from the upper surface portions of the substrate due to aging.

Figure 4:
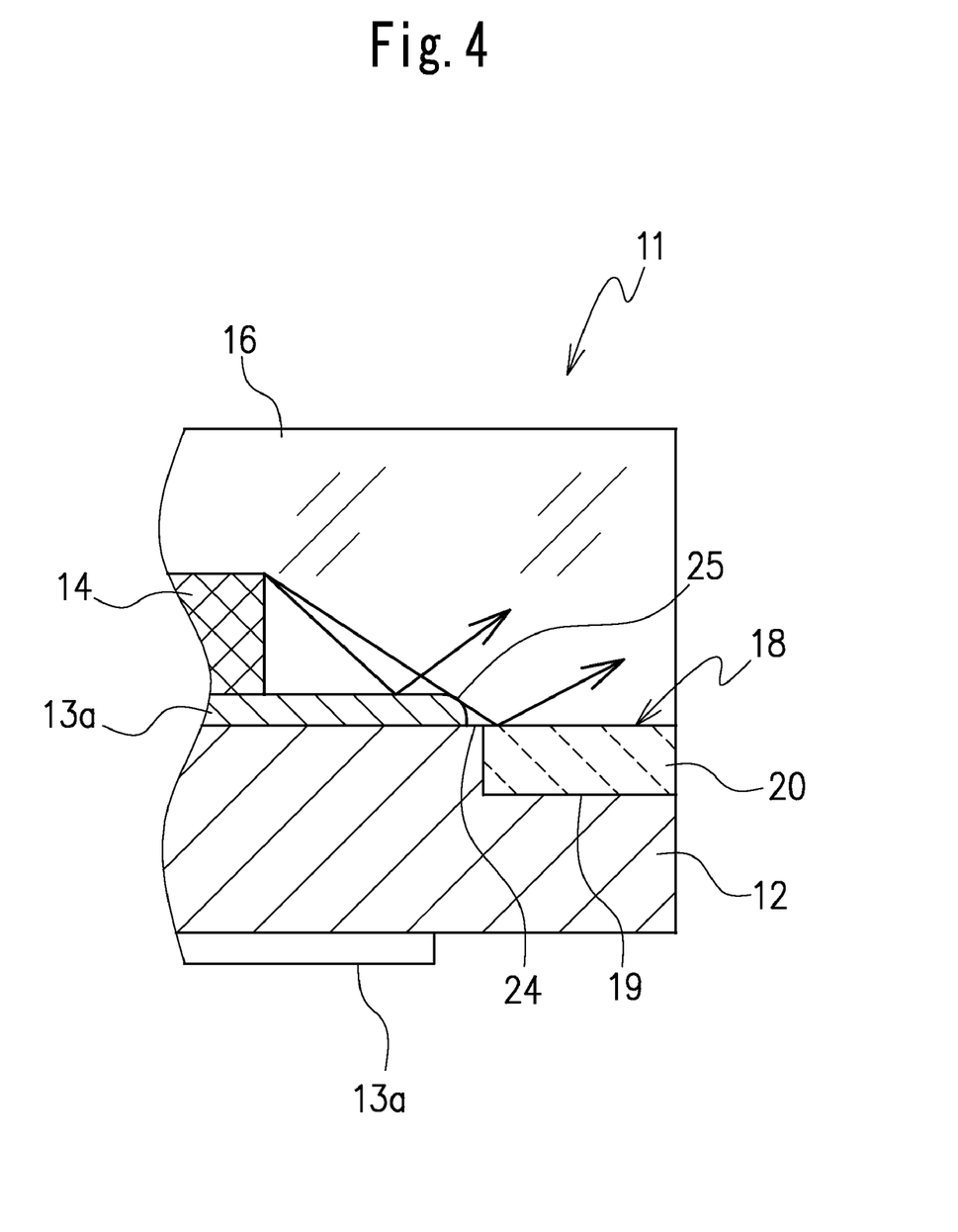
FIG. 4 is a partial sectional diagram showing light directed downward from a light-emitting surface of the light-emitting element according to the first embodiment.

The edging 24 of each of the upper surface portions has a width set to be less than a thickness of each of the pair of upper electrodes to prevent the edging 24 from receiving light emitted from the light-emitting element 14, as shown in FIG. 4.

In the LED 11 having the aforementioned structure, downwardly emitted light from the light-emitting element 14 is reflected on the upper electrode 13a and light directed downward over an edge 25 of the upper electrode 13a can be reflected upward on a reflection layer provided on an upper surface of the light-shielding resin 20 as shown in FIG. 4. It should be noted that because the edging 24 of the upper surface portion of the substrate 12 exposed from the upper electrode 13a is shaded by the thickness of the upper electrode 13a.

For the light-shielding resin 20, a white-colored resin material including such as a resist ink may be used, and the resin 20 is preferably a hybrid resin containing a silicone-based resin or silicone to enhance protection against light emitted from the light-emitting element 14. The light-shielding resin 20 made of the aforementioned material and disposed in the recess 19 provided in the upper surface area exposed from the pair of upper electrodes 13a and 13b is substantially flush with the edging 24 of the upper surface portions on which the upper electrodes 13a and 13b are formed.

The light-transmitting sealing member 16 made of a light-transmitting epoxy or silicone-based light-transmitting resin material seals the light-emitting element 14 and upper electrical connection portion including the upper electrodes 13a and 13b and the bonding wire 15 and is formed in a rectangular parallelepiped shape on the upper surface of the substrate.

In the LED 11 structured as mentioned above, the light emitting element 14 is excited and emits light when a voltage is applied to the element electrodes of the light-emitting element through electrical connection portion of the substrate 12. The light-emitting element 14 emits light from a light-emitting surface in all directions if there is no obstacles. Downwardly emitted light from the light-emitting element is shielded by the upper electrodes and the light-shielding resin 20 and is prevented from reaching the upper surface of the substrate 12. Though each of the edgings 24 of the upper surface portions of the substrate are exposed from both the upper electrodes 13a, 13b and the light-shielding resin 20, the edging 24 can be shaded by the thickness of the upper electrodes 13a and 13b as mentioned before.

In the aforementioned LED 11, the substrate 12 is configured to be formed in a square or a rectangular shape by a resin material such as epoxy or the like, and through-holes 17 are provided at the two opposite sides of the peripheral side surface of the substrate 12, and the upper electrodes 13a, 13b and lower electrodes 13a, 13b are formed in a predetermined shape by etching conductive films formed on the upper surface and the lower surface of the substrate 12. Next, the recess 19 is provided by etching or half-cutting the upper surface of the substrate 12 to have a predetermined depth, in a state where the upper surface portions of the substrate on which the upper electrodes 13a and 13b are provided and edgings 24 of the upper surface portions are masked. The recess 19 formed in this way is provided to extend from the upper surface of the substrate in a substantially perpendicular direction as the depth of the recess 19. In this embodiment, the depth of the recess 19 is set to be approximately a half of the thickness of the substrate 12.

Next, the light-shielding resin 20 is provided in the recess 19 and the upper surface of the light-shielding resin 20 is positioned to be flush with the edgings 24 of the upper surface portions of the substrate 12. Consequently, the upper surfaces of the light-shielding resin 20 and upper electrodes 13a, 13b appear to be flat.

Next, the light-emitting element 14 is die-bonded on one 13a of the pair of upper electrodes and connected through the bonding wire 15 to another 13b of the pair of upper electrodes. Finally, a mold (not shown) is disposed above the upper surface of the substrate 12, and the mold is filled with a light-transmitting resin material to form the light-transmitting sealing member 16 which is configured to seal the pair of upper electrodes 13a, 13b, the light-emitting element 14, the bonding wire 15 and the upper surface of the covering member 18.

Figure 5:
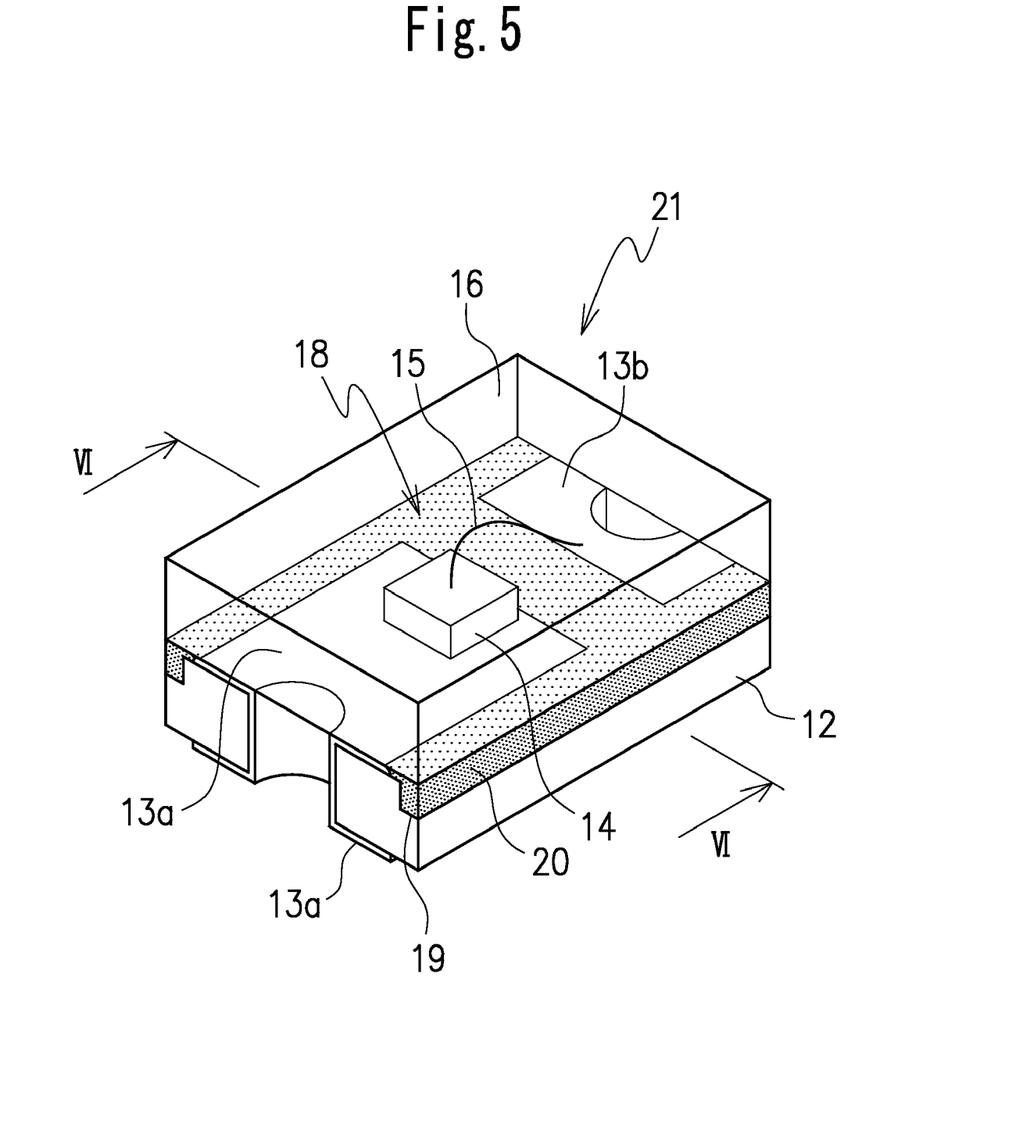
FIG. 5 is a perspective view showing a second embodiment of an LED according to a second embodiment of the present invention.
Figure 6:
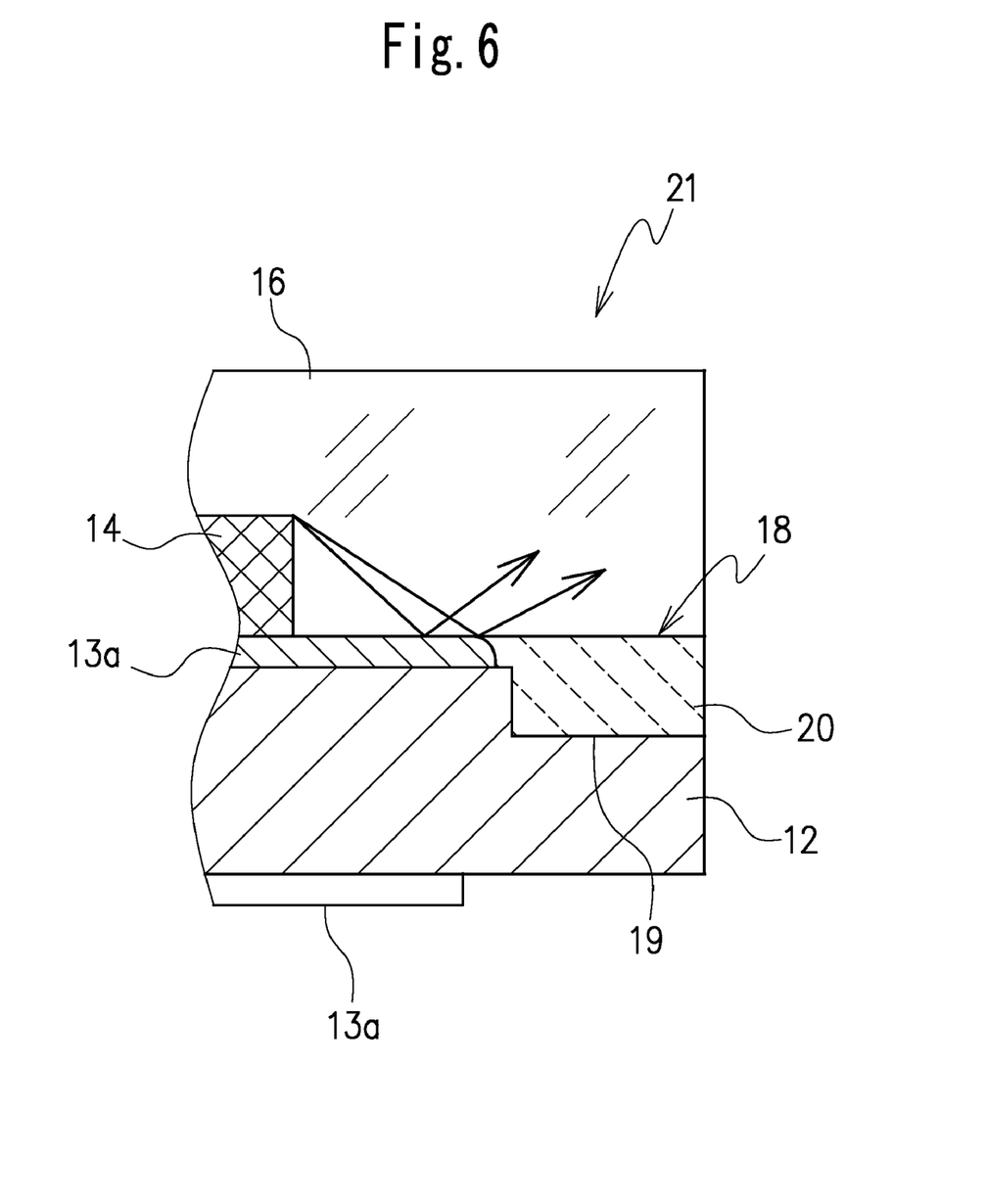
FIG. 6 is a partial sectional diagram taken along line VI-VI in FIG. 5, showing light directed downward from a light-emitting surface of the light-emitting element according to the second embodiment.

FIGS. 5 and 6 illustrate a structure of an LED according to a second embodiment of the present invention.

The LED 21 in the second embodiment has a structure in which the covering member 18 is provided, similarly to the first embodiment, but differs from the first embodiment in that the upper surface of the light-shielding resin 20 provided in the recess 19 is flush with the upper surfaces of the upper electrodes 13a and 13b (see FIG. 6). In this way, because the light-shielding resin 20 is configured to cover a side surface of each of the die-bonding electrode 13a and the wire-bonding electrode 13b together with the entire surface of the substrate 12 except upper surfaces of the upper electrodes 13a and 13b, without generating a gap between the peripheral side surface of each of the upper electrodes 13a and 13b and a peripheral side surface of the light-shielding resin 20, it is possible for the LED to minimize the influence on the substrate 12 due to light emitted from the light-emitting element 14.

In this second embodiment, because the upper surface of the light-shielding resin 20 is formed to be flush with the upper surfaces of the upper electrodes 13a and 13b, downward light emitted from the light-emitting element can be efficiently reflected upwardly on upper surfaces of the pair of upper electrodes 13a, 13b and light-shielding resin that may be made of white-colored resin or made of even a dark-colored resin with a reflection layer formed on the upper surface of the resin. Consequently, it is possible to efficiently prevent the upper surface of the substrate 12 from exposed to light from the light-emitting element and it is possible to reuse the downward light by reflecting it on the upper surfaces of the upper electrodes and the covering member.

Figure 7:
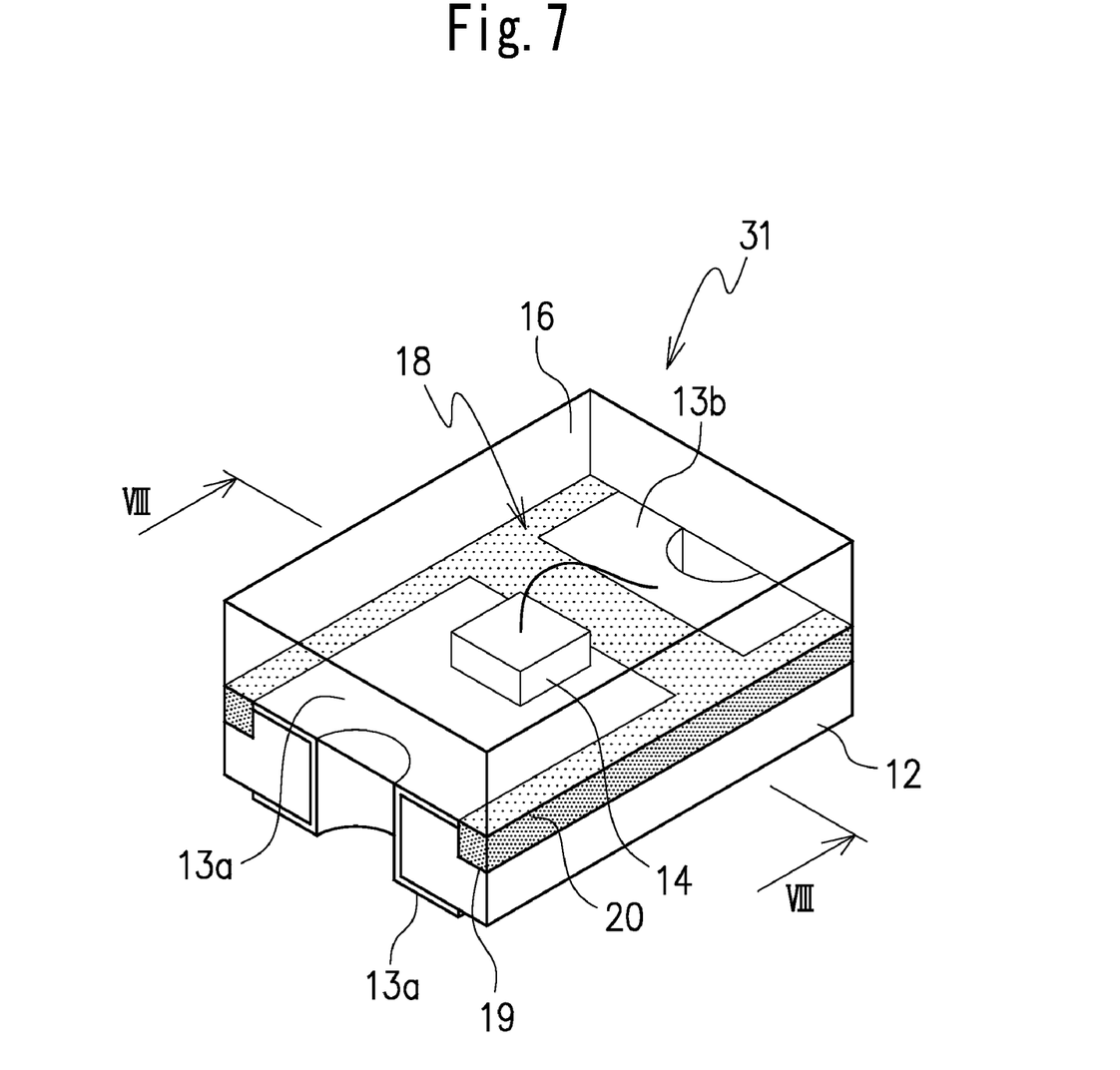
FIG. 7 is a perspective view showing a structure of an LED according to a third embodiment of the present invention.
Figure 8:
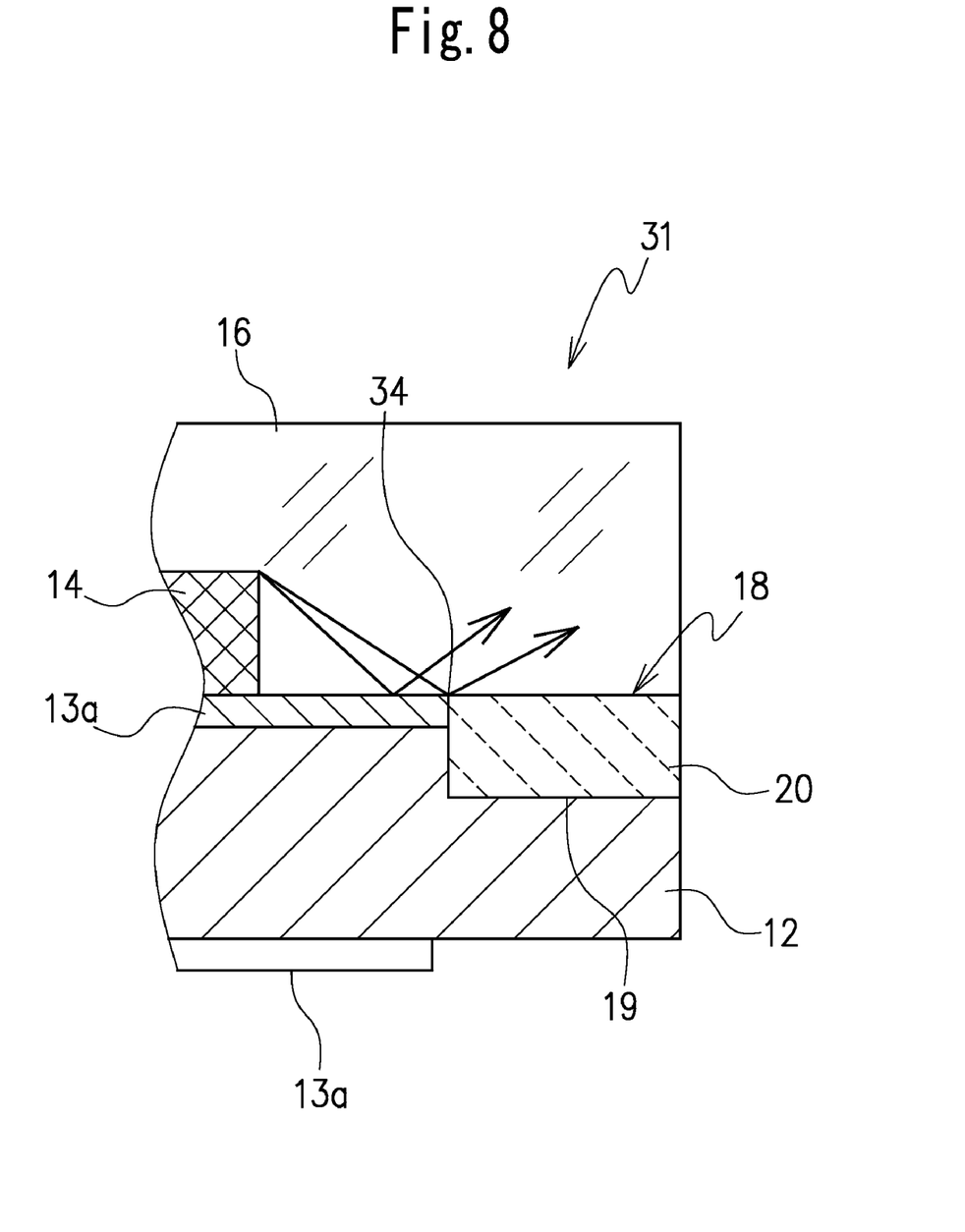
FIG. 8 is a partial sectional diagram taken along line VII-VII in FIG. 7, showing light directed downward from a light-emitting surface of the LED according to the third embodiment.

FIGS. 7 and 8 illustrate a structure of an LED 31 according to a third embodiment.

The LED 31 in the third embodiment includes a recess 19 provided in the upper surface of the substrate 12 with a peripheral side surface of the recess 19 extending flush with an outer circumferential edge surface of each of the pair of upper electrodes 13a and 13b, as shown in FIG. 8, without leaving an edging of an upper surface portion of the substrate on which an upper electrode is provided, the edging slightly exposed from the outer circumferential edge portion of each of the pair of upper electrodes 13a and 13b, as shown in the first and second embodiments. In addition, since a round portion or a gap is not provided at connecting flush portions of the outer peripheral side surface of each of the pair of upper electrodes 13a, 13b and a peripheral side surface of the recess 19, light-shielding resin can be smoothly filled in the recess to the level of the upper surface of each of the upper electrodes (see FIG. 8). In this embodiment the upper surfaces of the pair of upper electrodes 13a, 13b and the covering member 18 are flat and flush with one another.

In each of the aforementioned embodiments, the pair of upper electrodes 13a and 13b are disposed at a distance from each other to prevent a short circuit and the pair of upper electrodes 13a and 13b may be extend from the upper surface of a central area of the substrate 12 to the two opposite sides of the substrate where two through holes are provided respectively as shown in FIGS. 1-8. The recess and the light-shielding resin 20 filled in the recess may be provided along another two opposite sides of the substrate where the two through holes are not provided and the recess may be extended between the pair of upper electrodes, having a shape of H.

Alternatively, if the electrodes may be provided at the central area of the substrate 12 and each of the upper electrodes and each of the lower electrodes is connected by each of the through holes passing through the central area of the substrate as shown in the conventional FIG. 9, the recess 19 and the light-shielding resin 18 filled in the recess 19 can be provided to surround each of the pair of upper electrodes 13a, 13b. In this way, the recess 19 and the covering member 20 filled in the recess 19 can be provided in accordance with the shapes of the upper electrodes.

In short, it is possible to prevent the substrate from receiving light from the light-emitting element, by providing the covering member, including the recess and the light-shielding resin filled in the recess at the upper surface of the substrate exposed from the pair of upper electrodes.

In the LED in each of the embodiments as mentioned, a light reflection layer made of resin may be provided to cover all upper surfaces of the die-bonding electrode 13a and the light-shielding resin 20. The light reflection film may be made of a white system resin material when a dark-colored resin is used for light-shielding resin 20. Also, if the light-shielding resin 20 has a light-shielding function and a high light-reflection function, for example, colored in white, the reflection layer may not be necessary. However, the provision of the light reflection layer makes it possible to reflect the light emitted from the light-emitting element 14 efficiently upwardly, when the light-shielding resin has low reflectivity.

Also the light reflection layer may be provided only at the upper surface of the covering member 18 and in this case, the light reflection layer may be formed by spraying, applying a white system resin material or metal. It is possible to significantly reduce light or heat emitted from the light-emitting element 14, and display a maximized light reflection effect.

Although the preferred embodiments of the present invention have been described, it should be understood that the present invention is not limited to these embodiments, and that various modifications and changes can be made to the embodiments.

What is claimed is:

1. A light-emitting diode, comprising:
a substrate having an upper surface, a lower surface, and a peripheral side surface;

a pair of upper electrodes provided on portions of the upper surface of the substrate;

at least one light-emitting element electrically connected to the pair of upper electrodes and mounted on one of the pair of upper electrodes; and a covering member provided on the upper surface of the substrate except the portions at which the pair of upper electrodes are provided, wherein the covering member includes a recess provided in the upper surface of the substrate except the portions at which the pair of upper electrodes are provided, and a light-shielding resin filled in the recess.

2. The light-emitting diode according to claim 1, wherein the recess is formed throughout the entirety of the upper surface of the substrate except the portions at which the pair of upper electrodes are provided.

3. The light-emitting diode according to claim 1, further comprising a light-transmitting resin disposed on upper surfaces of the pair of upper electrodes and the covering member.

4. The light-emitting diode according to claim 1, wherein upper surfaces of the pair of upper electrodes is flush with an upper surface of the covering member.

5. The light-emitting diode according to claim 1, wherein the light-shielding resin includes a hybrid silicone resin.

6. The light-emitting diode according to claim 1, wherein the light-shielding resin is a white-colored resin.

7. The light-emitting diode according to claim 1, further comprising a light reflection layer provided on an upper surface of the covering member.

8. The light-emitting diode according to claim 7, wherein the light reflection layer comprises a white resin material.

9. The light-emitting diode according to claim 7, wherein the light reflection layer comprises a metal.

10. The light-emitting diode according to claim 1, wherein each of the upper surface portions of the substrate has an edging exposed from each of the pair of upper electrodes.

11. The light-emitting diode according to claim 10, wherein each of the upper surface portions of the substrate is larger than each corresponding upper electrode for a width of the edging.

12. The light-emitting diode according to claim 11, wherein the width of the edging is smaller than a thickness of each of the pair of upper electrodes.

13. The light-emitting diode according to claim 1, further comprising a pair of lower electrodes provided on portions of the lower surface of the substrate, a pair of through holes each passing through the substrate and electrically connecting each of the upper electrodes and each of the lower electrodes, and the recess being provided along the peripheral side surface of the substrate and between the pair of upper electrodes.

14. The light-emitting diode according to claim 1, further comprising a pair of lower electrodes provided on portions of the lower surface of the substrate, the peripheral side surface of the substrate has four sides, a pair of through holes each provided at first two opposite sides of the peripheral side surface of the substrate and electrically connecting each of the upper electrodes and each of the lower electrodes, and the recess being provided in the upper surface of the substrate along second two opposite sides.

* * * * *